(12) United States Patent
Chu (10) Patent No.: US 12,305,796 B2
(45) Date of Patent: May 20, 2025

(54) STANDS WITH GEARS

(71) Applicant: Hewlett-Packard Development Company, L.P., Spring, TX (US)

(72) Inventor: Chia-Hua Chu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 204 days.

(21) Appl. No.: 18/004,394

(22) PCT Filed: Jul. 8, 2020

(86) PCT No.: PCT/US2020/041231
§ 371 (c)(1),
(2) Date: Jan. 5, 2023

(87) PCT Pub. No.: WO2022/010472
PCT Pub. Date: Jan. 13, 2022

(65) Prior Publication Data
US 2023/0243461 A1  Aug. 3, 2023

(51) Int. Cl.
  *H05K 5/02* (2006.01)
  *F16M 11/04* (2006.01)
  *F16M 11/10* (2006.01)
  *F16M 11/18* (2006.01)
(52) U.S. Cl.
  CPC ........... *F16M 11/18* (2013.01); *F16M 11/046* (2013.01); *F16M 11/105* (2013.01); *H05K 5/0234* (2013.01); *F16M 2200/022* (2013.01)
(58) Field of Classification Search
  CPC ............... H05K 5/0017; H05K 5/0217

USPC ................. 361/807, 809, 810, 755
See application file for complete search history.

(56) References Cited

U.S. PATENT DOCUMENTS

| | | | |
|---|---|---|---|
| 7,448,580 B2 | 11/2008 | Shimizu et al. | |
| 2004/0004165 A1 | 1/2004 | Hong et al. | |
| 2004/0035989 A1 | 2/2004 | Sweere et al. | |
| 2005/0205725 A1* | 9/2005 | Yokouchi | F16M 11/2021 248/125.1 |
| 2006/0175476 A1 | 8/2006 | Hasegawa et al. | |
| 2007/0205341 A1 | 9/2007 | Chih et al. | |
| 2009/0189047 A1* | 7/2009 | Means | F16M 11/28 248/354.1 |
| 2013/0075546 A1 | 3/2013 | Peng et al. | |
| 2019/0232884 A1* | 8/2019 | Yamada | B60R 11/0235 |

FOREIGN PATENT DOCUMENTS

| | | | | |
|---|---|---|---|---|
| CN | 101566264 A | | 10/2009 | |
| CN | 113055517 A | * | 6/2021 | ............... G06F 1/16 |
| JP | 2005121918 A | * | 5/2005 | ............. G03B 21/14 |
| JP | 4741846 B2 | | 8/2011 | |
| JP | 6452986 B2 | | 1/2019 | |
| KR | 20180058945 A | * | 6/2018 | ............... H04M 1/04 |
| WO | WO-2021085941 A1 | * | 5/2021 | ........... F16M 11/046 |

* cited by examiner

*Primary Examiner* — Hung S. Bui
(74) *Attorney, Agent, or Firm* — Quarles & Brady LLP (57) ABSTRACT

Examples of stands and display devices are described. In an example, a stand may be coupled to a pair of racks, a driving gear, and a pair of pinion gears. The pair of pinion gears may be operably coupled to the driving gear. Further, the pair of pinion gears may be meshed with the pair of racks. Upon actuation of the driving gear, the pair of pinion gears may be rotated relative to the pair of racks to cause movement of the gears along the pair of racks.

19 Claims, 10 Drawing Sheets

STANDS WITH GEARS

BACKGROUND

A device with a display screen, such as a liquid crystal display (LCD) display screen, may include a stand with a base. The display screen may be coupled to the stand for placing the display device on a surface. The stand may allow a user to move the display device as per the user's convenience for viewing the content that are displayed on the display screen.

BRIEF DESCRIPTION OF FIGURES

The detailed description is provided with reference to the accompanying figures, wherein.

DETAILED DESCRIPTION

With the advancement of information technology (IT), devices having display screens have become a norm of modern electronic design. In addition, upcoming display screen technologies have facilitated in replacement of cathode ray tube (CRT) displays with light weight and small dimensional liquid crystal displays (LCD). Although small size of electronic devices may enhance portability and operational flexibility, there exists certain areas where display devices are to be mounted for ease of operation. For example, a display device for use with a personal computer may include a stand and a display unit. The display unit may have an elongate rectangular shape and is coupled to the stand. Such a stand may include a hinge assembly interposed between a rear of display unit and a columnar member of the stand to allow a user of the display unit to adjust an angle of the display unit. The display unit may be used selectively in a landscape display mode or a portrait display mode depending on how content is to be displayed on the display unit.

The orientation or display mode of the display unit may be changed by rotating the display unit with respect to the stand. With the rectangular shape of the display unit, the rotation of the display unit from the landscape display mode to the portrait display mode may cause a collision of the display unit with the surface on which the base of the stand rests. To avoid the collision between the display unit and the surface, a user may lift the display device to certain height before rotating the display unit. This may be time consuming and inconvenient for a user.

The present subject matter discloses example stands for display devices and display devices with such stands. The example stands described herein prevent, while rotating the display unit, a collision between a display unit of a display device and a surface on which the display device is placed. In an example, the stand may include a base and a column affixed to the base. The stand may also include a pair of rack gears coupled to a free end of the column. The stand may further include a gear train having a plurality of gears. For example, the gear train may include a mutilated driving gear and a pair of pinion gears. The pair of pinion gears may be meshed with the pair of rack gears.

The display unit of a display device may be coupled to the mutilated driving gear, such that when the display unit is rotated, the mutilated driving gear may actuate the pair of pinion gears. Due to the engagement of the pair of pinion gears with the pair of rack gears, rotational motion of the pair of pinion gears may get translated into a linear motion. Thus, when the display unit is turned from the landscape display mode to the portrait display mode, the pair of pinion gears moves upwards along the pair of rack gears for vertically moving the display unit. When the display unit is turned from the portrait display mode to the landscape display mode, the pair of pinion gears moves in a downward direction, towards the base of the stand, along the pair of rack gears.

Accordingly, the display unit is prevented from colliding with the surface on which the base of the stand rests, when the display unit is turned between the landscape display mode and the portrait display mode. In addition, the gear train facilitates in reducing a size of the gears at the same time incrementing a height of the display unit. Furthermore, the gear train may facilitate in moving the display unit along the pair of rack gears upon a slight turn of the display unit.

The present subject matter is further described with reference to the accompanying figures. Wherever possible, the same reference numerals are used in the figures and the following description to refer to the same or similar parts. It should be noted that the description and figures merely illustrate principles of the present subject matter. It is thus understood that various arrangements may be devised that, although not explicitly described or shown herein, encompass the principles of the present subject matter. Moreover, all statements herein reciting principles, aspects, and examples of the present subject matter, as well as specific examples thereof, are intended to encompass equivalents thereof.

The manner in which the stand and the display device are implemented are explained in detail with respect to FIGS. 1-8(c). While aspects of described stand and display device can be implemented in any number of different electronic devices, environments, and/or implementations, the examples are described in the context of the following system(s). It is to be noted that drawings of the present subject matter shown here are for illustrative purposes and are not drawn to scale.

Figure 1:
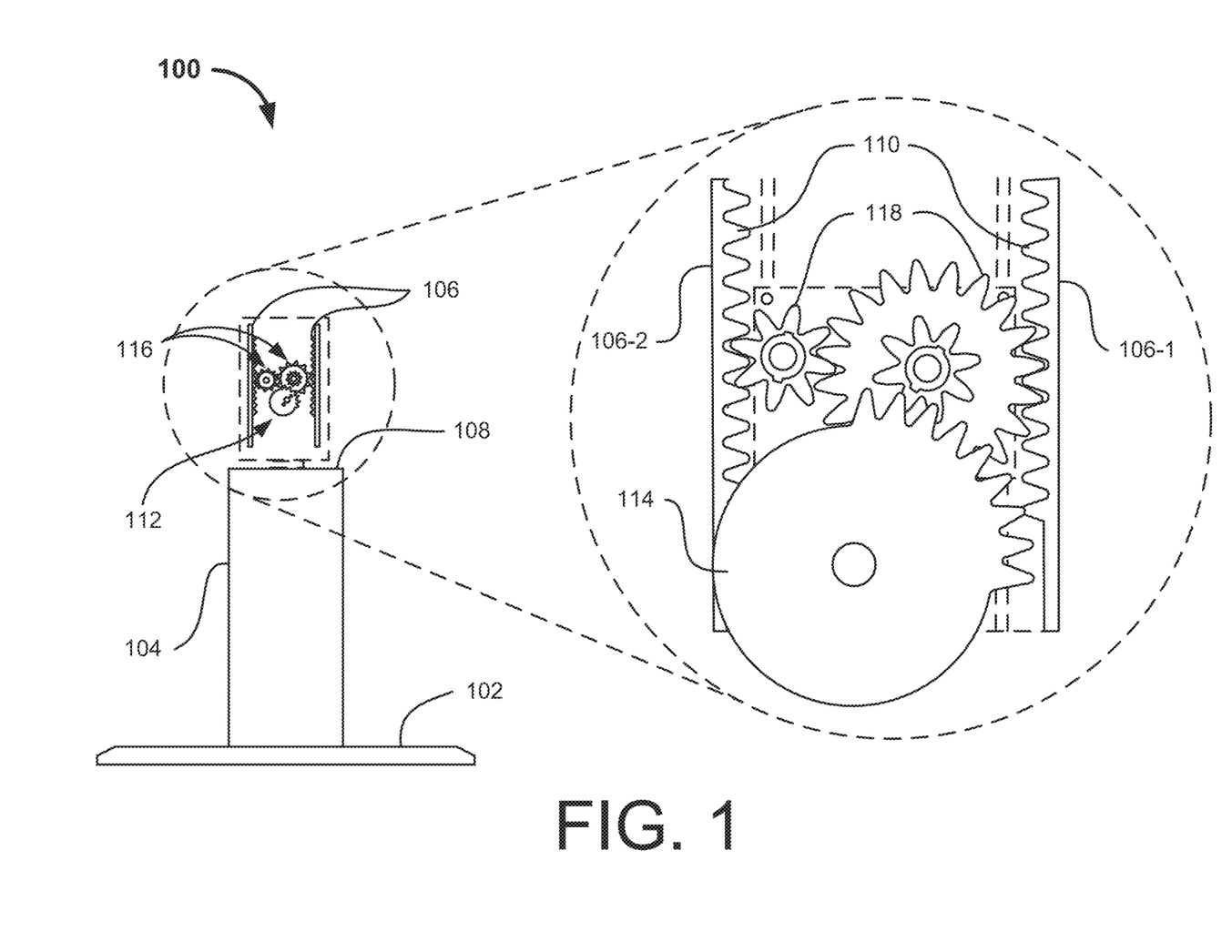
FIG. 1 illustrates a schematic view of a stand, according to an example.

FIG. 1 illustrates a schematic view of a stand 100, according to an example. The stand 100 includes a base 102 and a column 104 fixedly mounted on the base 102. In one example, the base 102 and the column 104 may be integrated. In another example, the column 104 may be fixedly attached to the base 102 while arranging the stand 100. In an example, stand 100 may be made of a rigid material, such as a metal or polymer.

The stand 100 also includes a pair of rack gears 106 including a first rack gear 106-1 and a second rack gear 106-2. In an example, the pair of rack gears 106 may be coupled to a free end 108 of the column 104. The free end 108 of the column 104 may be an end of the column 104 that is not attached to the base 102. In an example, the pair of rack gears 106 may be arranged on a bracket (not shown)

coupled to the free end 108 of the column 104. The pair of rack gears 106 may be linear gears. Each rack gear of the pair of rack gears 106 includes a plurality of teeth 110 for engaging with corresponding gears. In an example, the pair of rack gears 106 may be straight rack gears or angled rack gears, i.e., the plurality of teeth 110 provided on each rack gear may be straight or angled.

The stand 100 further includes a gear train 112 operably coupled to the pair of rack gears 106. The gear train 112 includes a mutilated driving gear 114 and a pair of pinion gears 116. The mutilated driving gear 114 may be a driving gear having a number of teeth cut away to provide intermittent motion. Further, the pair of pinion gears 116 may be operably coupled to the mutilated driving gear 114. In an example, the pair of pinion gears 116 may be external spur gears with teeth 118 pointing outwards from a central wheel. For example, gear train 112 may include additional gears (not shown) positioned between the mutilated driving gear 114 and the pair of pinion gears 116 such that the actuation of the mutilated driving gear 114 may impart motion to the pair of pinion gears 116 through the additional gears.

In an example implementation, the pair of pinion gears 116 is meshed with the pair of rack gears 106. For example, the teeth 118 of the pair of pinion gears 116 engages with corresponding teeth 110 of the pair of rack gears 106. Upon actuation of the mutilated driving gear 114, the pair of pinion gears 116 may be rotated relative to the pair of rack gears 106, thereby causing movement of the gear train 112 along the pair of rack gears 106. For example, the rack and pinion gears transform a rotary motion of the pair of pinion gears 116 into a rectilinear motion.

Accordingly, the stand 100 may facilitate in adjusting height of a body member (not shown) that may be mounted on the column 104. The body member may be coupled to the pair of rack gears 106 and the gear train 112. The movement of the gear train 112 along the pair of rack gears 106 may prevent collision of the body member with a surface on which the base 102 of the stand 100 rests, when the body member may be rotated.

Figure 2:
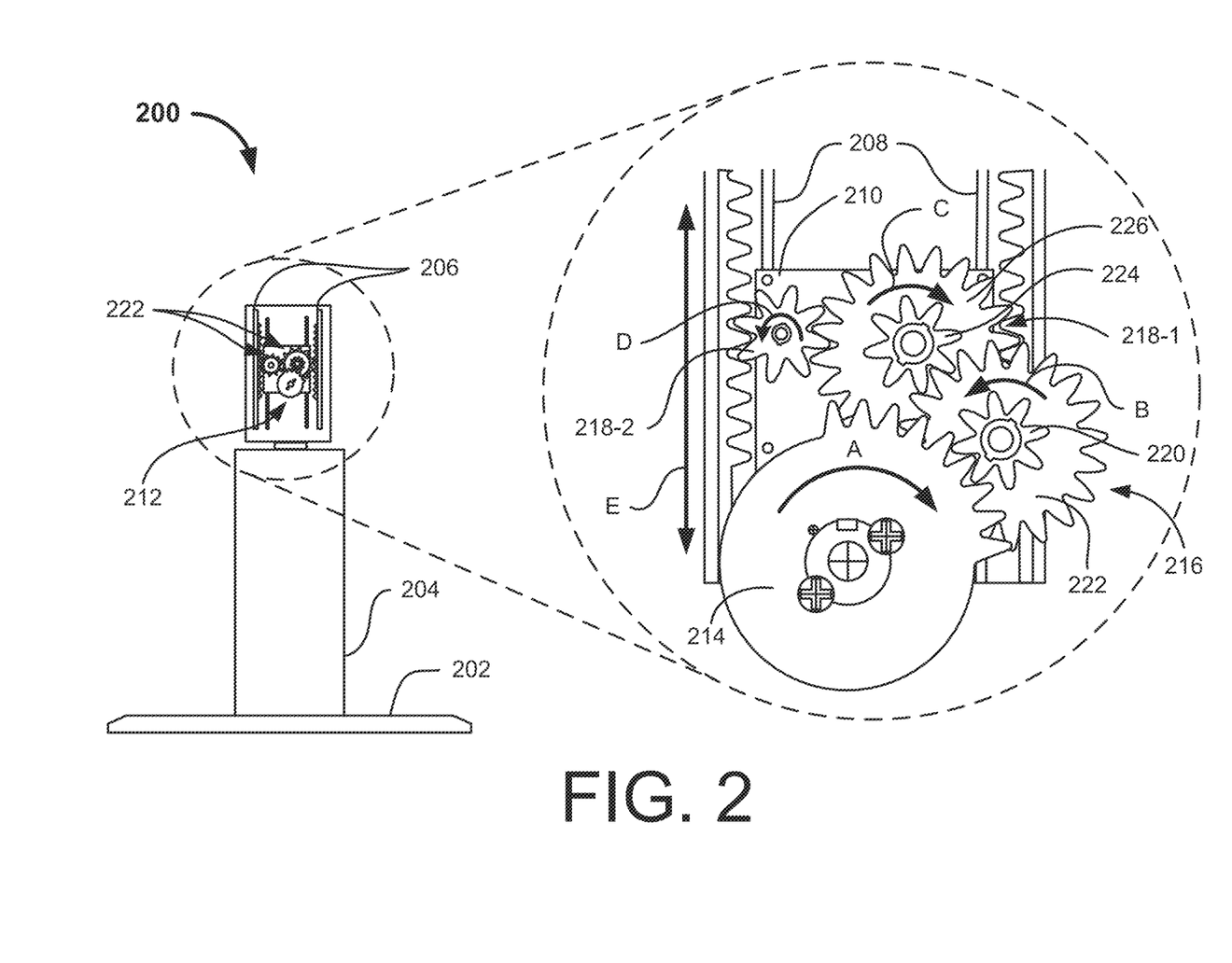
FIG. 2 illustrates a schematic view of a stand, according to an example.

FIG. 2 illustrates a schematic view of a stand 200, according to an example. The stand 200 includes a base 202, a column 204, and a pair of rack gears 206. The stand 200 may be similar to the stand 100 and the base 202, column 204, and the pair of rack gears 206 are arranged in a manner as described in detail with reference to FIG. 1. In an example, the pair of rack gears 206 is in a plane parallel to a plane of the column 204.

The stand 200 further includes a guide rail 208 along a length of the pair of rack gears 206. Further, the stand 200 includes a base plate 210 slidably mounted on the guide rail 208. In an example, the guide rail 208 may be in the form of rods and the base plate 210 may include wheels for sliding or rolling over the rods. In another example, the guide rail 208 may be in the form of grooves and the base plate 210 may engage with the grooves for sliding along the guide rail 208. In the present example, the base plate 210 may include protruding members that may engage with the grooves for facilitating sliding of the base plate 210 along the guide rail 208.

Further, the stand 200 includes a gear train 212 similar to the gear train 112 and arranged in a manner as described in detail with reference to FIG. 1. The gear train 212 is mounted on the base plate 210. The base plate 210 may be a static plate and may not rotate with the rotation of the gear train 212. The gear train 212 includes a mutilated driving gear 214, a driven gear 216, and a pair of pinion gears 218. In an example, the pair of rack gears 206 and the pair of pinion gears 218 may be made of a plastic material. Further, the gear train 212 may be pivotally connected to the base plate 210. For example, the gear train 212 may mounted on the base plate 210 by means of spindles (not shown). Although in the present disclosure the mutilated driving gear 214 is depicted to have teeth on approximately one-quarter of a circumference of the mutilated driving gear 214, the mutilated driving gear 214 may have any number of teeth on any portion of the circumference of the mutilated driving gear 214.

In an example, the driven gear 216 may be an idler gear meshable with the mutilated driving gear 214 and a pinion gear from the pair of pinion gears 218 such that the pair of pinion gears 218 may not be directly coupled to the mutilated driving gear 214. As depicted in FIG. 2, the driven gear 216 and a first pinion gear 218-1 is a double spurred gear. For example, the driven gear 216 includes a first wheel 220 and a second wheel 222 and the first pinion gear 218-1 includes a first wheel 224 and a second wheel 226.

In an assembled state of the gear train 212, the teeth of the mutilated driving gear 214 engage with the teeth of the first wheel 220 of the driven gear 216. Further, the teeth of the second wheel 222 of the driven gear 216 engage with the first wheel 224 of the first pinion gear 218-1. In addition, teeth of the second wheel 226 of the first pinion gear 218-1 mesh with corresponding teeth of the second pinion gear 218-2.

Upon actuation of the mutilated driving gear 214 in a clockwise direction as depicted by arrow A, the driven gear 216 rotates in an anticlockwise direction, as depicted by arrow B. In an example, the mutilated driving gear 214 is rotatable by an angle of about 90 degrees. The rotation of the driven gear 216 causes the first pinion gear 218-1 to rotate in a clockwise direction as depicted by arrow C. Further, as the first pinion gear 218-1 is mechanically interfaced with the second pinion gear 218-2, the clockwise rotation of the first pinion gear 218-1 cause the second pinion gear 218-2 to rotate in the anticlockwise direction as depicted by arrow D. As the teeth of the pair of pinion gears 218 is meshed with the corresponding teeth of the pair of rack gears 206, the rotational motion of the pair of pinion gears 218 gets converted into a rectilinear motion. As a result, the base plate 210 bearing the gear train 212 moves up and down along the pair of rack gears 206 as depicted by arrow E. For example, due to the engagement of the pair of pinion gears 218 with the pair of rack gears 206, rotational motion of the pair of pinion gears 218 may get translated into a linear motion. Thus, rotation of the pair of pinion gears 218 relative to the pair of rack gears 206 may move the base plate 210 along the guide rail 208.

Figure 3:
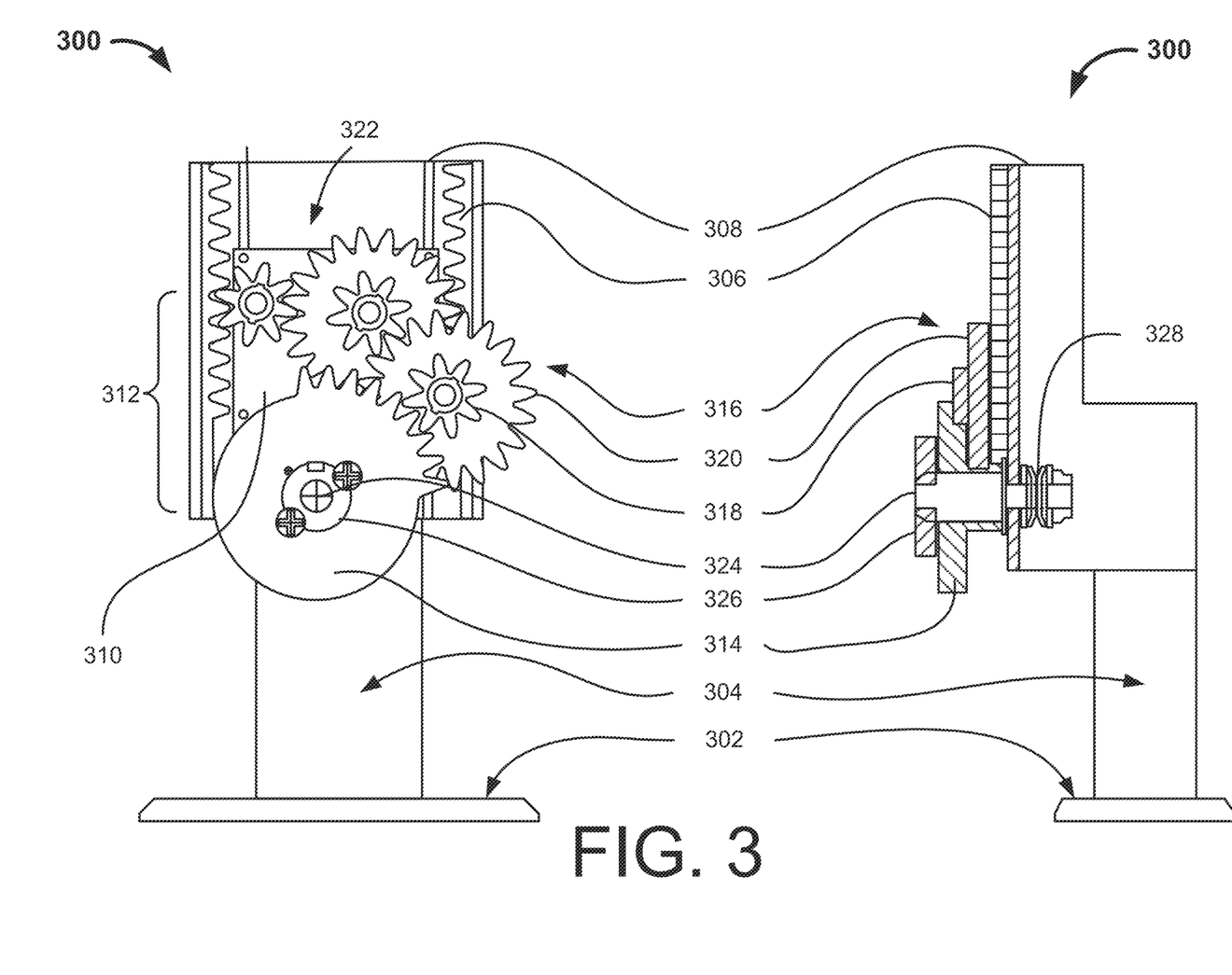
FIG. 3 illustrates a front and a cross-sectional view of a stand, according to an example.

FIG. 3 illustrates a front and a cross-sectional view of a stand 300, according to an example. In an example, FIG. 3 depicts an assembled state of the stand 300. The stand 300 includes a base 302, a column 304, a pair of rack gears 306, and a guide rail 308. Further, the stand 300 includes a base plate 310 to support a gear train 312. The gear train 312 may include a plurality of gears that may be work in tandem to provide a functionality through a gear ratio. The gear train 312 includes a mutilated driving gear 314, a driven gear 316 having a first wheel 318 and a second wheel 320, and a pair of pinion gears 322. The stand 300 may be similar to the stand 200 and various components of the stand 300 are arranged in a manner as described in detail with reference to FIG. 2.

In an example, the mutilated driving gear 314 pivots about a pivot pin 324. The pivot pin 324 may be affixed to the mutilated driving gear 314 by a fastening mechanism 326.

Examples of the fastening mechanism 326 may include but are not limited to, nut and bolts, pins and rivets, and screws. In an example implementation, the stand 300 may also include a friction pad 328. The friction pad 328 may be coupled to the pivot pin 324 to prevent the pivot pin 324 from rotating freely and providing a controlled rotation of the gear train 312.

Figure 4:
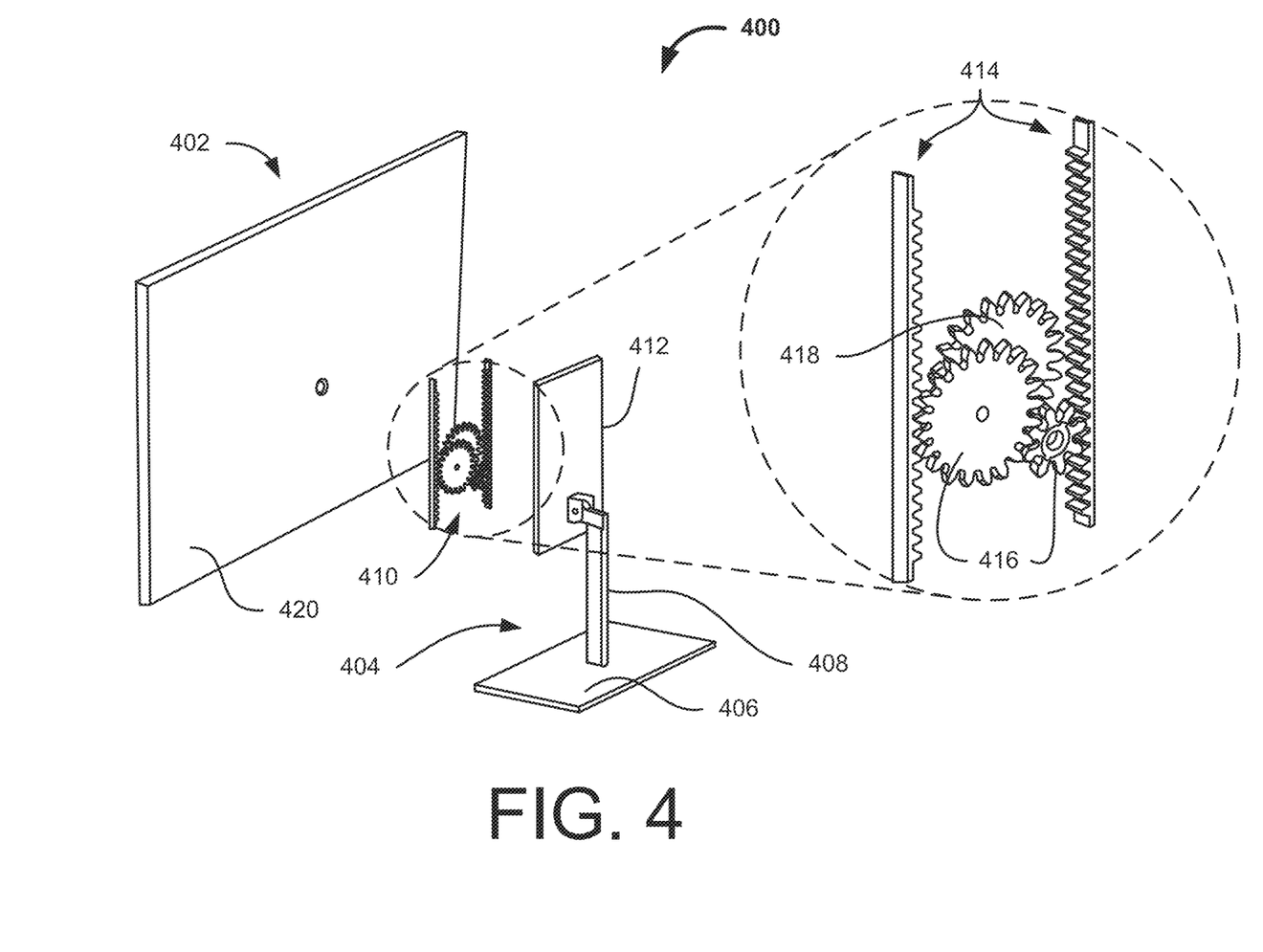
FIG. 4 illustrates a schematic view of a display device, according to an example.

FIG. 4 illustrates a schematic view of a display device 400, according to an example. The display device 400 may be an output device for displaying information in visual form by means of a display unit 402. Examples of the display unit 402 may include, but are not limited to, a plasma display unit, a liquid crystal display (LCD) unit, a light emitting diode (LED) display unit, an organic light emitting diode (OLED) display unit. The display unit 402 may have an elongate rectangular shape with vertical and horizontal dimensions different from each other.

The display device 400 also includes a stand 404 for supporting the display unit 402. The stand 404 includes a base 406 and a column 408 affixed to the base 406. The display unit 402 may be coupled to a free end of the column 408 by a gear assembly 410. The gear assembly 410 may be pivotably coupled to the free end of the column 408. For example, a driving gear or an actuating gear of the gear assembly 410 may be pivoted on the column 408 for allowing rotation of the display unit 402.

In an example, the gear assembly 410 includes a bracket 412 and a pair of toothed racks 414 disposed along a length of the bracket 412. For example, the bracket 412 may be a holding member that attaches the gear assembly 410 to the column 408. In the present implementation, the bracket 412 is pivotably coupled to the column 408 by a hinge. Further, the pair of toothed racks 414 may be linear gears.

The gear assembly 410 further includes a pair of pinion gears 416 that may cooperate with the pair of the toothed racks 414, thus forming a pinion-and-rack arrangement. In an example, the gear assembly 410 also includes a driving gear 418 operably coupled to the pair of pinion gears 416. For example, the gear assembly 410 may include additional gears (not shown) positioned between the driving gear 418 and the pair of pinion gears 416 such that the actuation of the driving gear 418 may impart motion to the pair of pinion gears 416 through the additional gears.

In an example implementation, the display unit 402 may be coupled to the driving gear 418. For example, a rear portion 420 of the display unit 402 may be attached to the gear assembly 410 such that an axis of rotation of the display unit 402 is same as the axis of rotation of the driving gear 418.

In a normal viewing position, when a user may face a screen of the display unit 402, the display unit 402 may be considered to be in a landscape orientation. For example, in the landscape orientation, the display unit 402 is oriented horizontally, i.e., the display unit 402 is wider than it is tall. To change the orientation of the display unit 402, when the display unit 402 is rotated, the driving gear 418 may get actuated. The actuation of the driving gear 418 may indicate a rotation of the driving gear 418 in the same direction as that of the display unit 402. The actuation of the driving gear 418 may cause the pair of pinion gears 416 to rotate relative to the pair of toothed racks 414. For example, due to the engagement of the pair of pinion gears 416 with the pair of toothed racks 414, rotational motion of the pair of pinion gears 416 may get translated into a linear motion. The rotation of the pair of pinion gears 416 may impart translational motion in the display unit 402 along a length of the pair of toothed racks 414.

Figure 5:
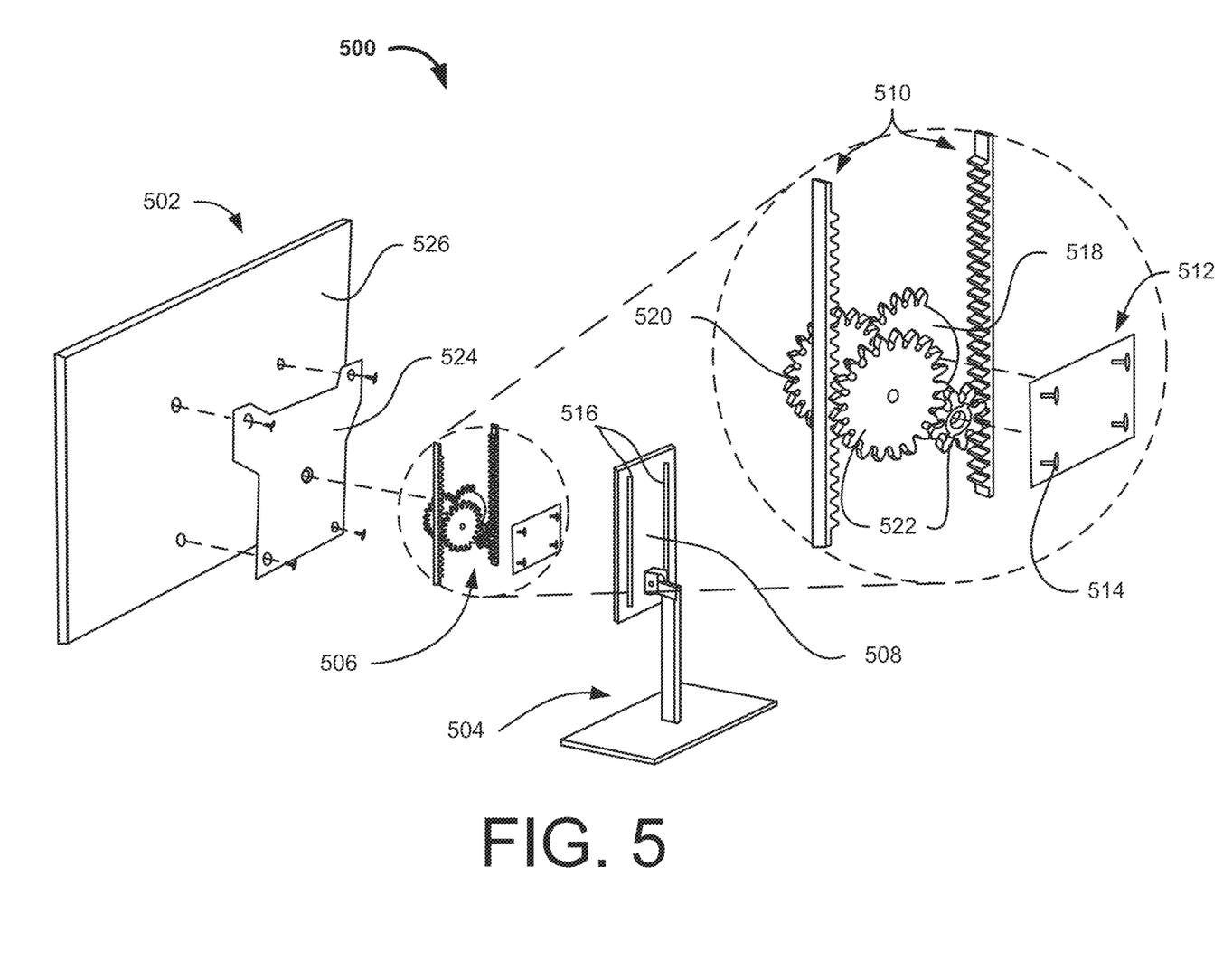
FIG. 5 illustrates an exploded view of a display device, according to an example.

FIG. 5 illustrates an exploded view of a display device 500, according to an example. The display device 500 may be similar to the display device 400. For example, the display device 500 includes a display unit 502, a stand 504, and a gear assembly 506. The gear assembly 506 includes a bracket 508, a pair of toothed racks 510 disposed along a length of the bracket 508, a base plate 512 slidably mounted on the bracket 508.

In an example, the base plate 512 includes protruding members 514 extending away from the base plate 512. Further, the bracket 508 include slots 516 that may cooperate with the protruding members 514 of the base plate 512 to slide the base plate 512 along the bracket 508. The protruding members 514 and the slots 516 may cooperate in a manner such that the base plate 512 may move vertically along the length of the bracket 508.

In an example, the base plate 512 may support a plurality of gears, such as a driving gear 518, a driven gear 520, and a pair of pinion gears 522. In the present example, the driving gear 518 is a mutilated gear and is referred to as a mutilated driving gear 518. The stand 504, the bracket 508, the pair of toothed racks 510, the base plate 512, and the plurality of gears are similar to corresponding components of the stand 200. Further, the above-listed components are arranged in a manner as described in detail with reference to FIG. 2.

In an example implementation, the display device 500 includes a mounting plate 524 for mounting the display unit 502 to the stand 504. The mounting plate 524 may be rotatably coupled to the display unit 502. The mounting plate 524 may be positioned between a rear portion 526 of the display unit 502 and the mutilated driving gear 518 such that an axis of rotation of the display unit 502 is same as the axis of rotation of the mutilated driving gear 518. In an example, the mounting plate 524 may be connected to the gear assembly 506 and the rear portion 526 of the display unit 502 by fasteners, such as but not limited to, nut and bolts, pins and rivets, and screws. In an example, the mounting plate 524 may be made of a metal.

Figure 6:
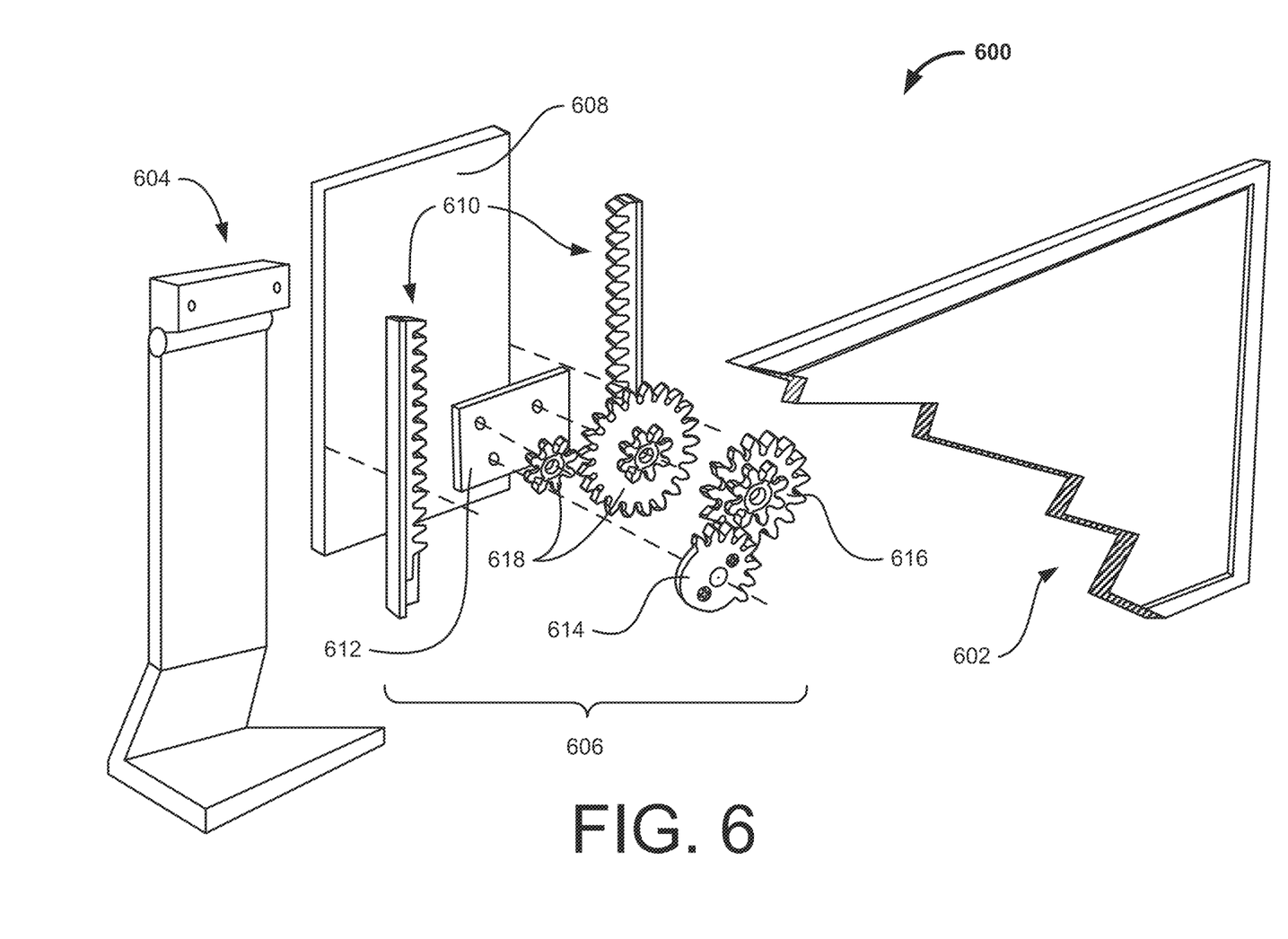
FIG. 6 illustrates an exploded view of a display device, according to an example.

FIG. 6 illustrates an exploded view of a display device 600, according to an example. Examples of the display device 600 may include, but are not limited to, a monitor of a computing device and a television. The display device 600 may be similar to the display device 400 and may include a display unit 602. Examples of the display unit 602 may include, but are not limited to, a plasma display unit, a liquid crystal display (LCD) unit, light emitting diode (LED) display unit, organic light emitting diode (OLED) display unit. The display unit 602 may have an elongate rectangular shape with vertical and horizontal dimensions different from each other.

The display device 600 may also include a stand 604 and a gear assembly 606 hingedly connected to the stand 604. The hinge connection between the gear assembly 606 and the stand 604 may facilitate in adjusting an angle of the display unit 602.

In an example, the gear assembly 606 includes a bracket 608 and a pair of toothed racks 610 fixedly mounted along a length of the bracket 608. Further, the pair of toothed racks 610 are parallel to each other. The pair of toothed racks 610 are similar to the pair of rack gears 106 and thus are not elaborated here for the sake of brevity.

The gear assembly 606 includes a base plate 612 disposed on the bracket 608 such that the base plate 612 is movable between the pair of toothed racks 610. Further, the gear assembly 606 includes a plurality of gears mounted on the base plate 612. The plurality of gears may be rotatably mounted on the base plate 612, for example, by spindles. The plurality of gears may include a mutilated driving gear 614, a driven gear 616 meshable with the mutilated driving gear 614, and a pair of pinion gears 618 operably coupled to the driven gear 616. In an example, the pair of pinion gears 618 may be meshed with the pair of toothed racks 610, thus forming a pinion-and-rack arrangement. In an example, the driven gear 616 may be an idler gear which is inserted between the mutilated driving gear 614 and a pinion gear to change a direction of rotation of the pinion gear.

Although the plurality of gears is depicted to have spur gears, any other kind of gears may be employed for the purposes of the present subject matter.

In an assembled state, the display unit 602 may be rotatably coupled to the gear assembly 606, such as through a pivot mechanism. Further, in the assembled state, the teeth of the pair of pinion gears 618 engage with the teeth of the pair of toothed racks 610. The driven gear 616 is positioned between the mutilated driving gear 614 and the pair of pinion gears 618 such that teeth of the driven gear 616 mesh with the teeth of a pinion gear. Further, the display unit 602 may be coupled to the mutilated driving gear 614.

Accordingly, upon rotation of the display unit 602, the mutilated driving gear 614 may actuate the driven gear 616 to initiate rotation of the pair of pinion gears 618 relative to the pair of toothed racks 610. For example, due to the engagement of the pair of pinion gears 618 with the pair of toothed racks 610, rotational motion of the pair of pinion gears 618 may get translated into a linear motion. The rotation of the pair of pinion gears 618 therefore causes the display unit 602 to move along a length of the pair of the toothed racks 610. As a result, the display unit 602 may be easily rotated from one orientation to another orientation without colliding with a base of the stand 604 or a surface on which the display device 600 is placed. Details pertaining to the gear assembly 606 will be described in detail in conjunction with FIG. 7.

Figure 7:
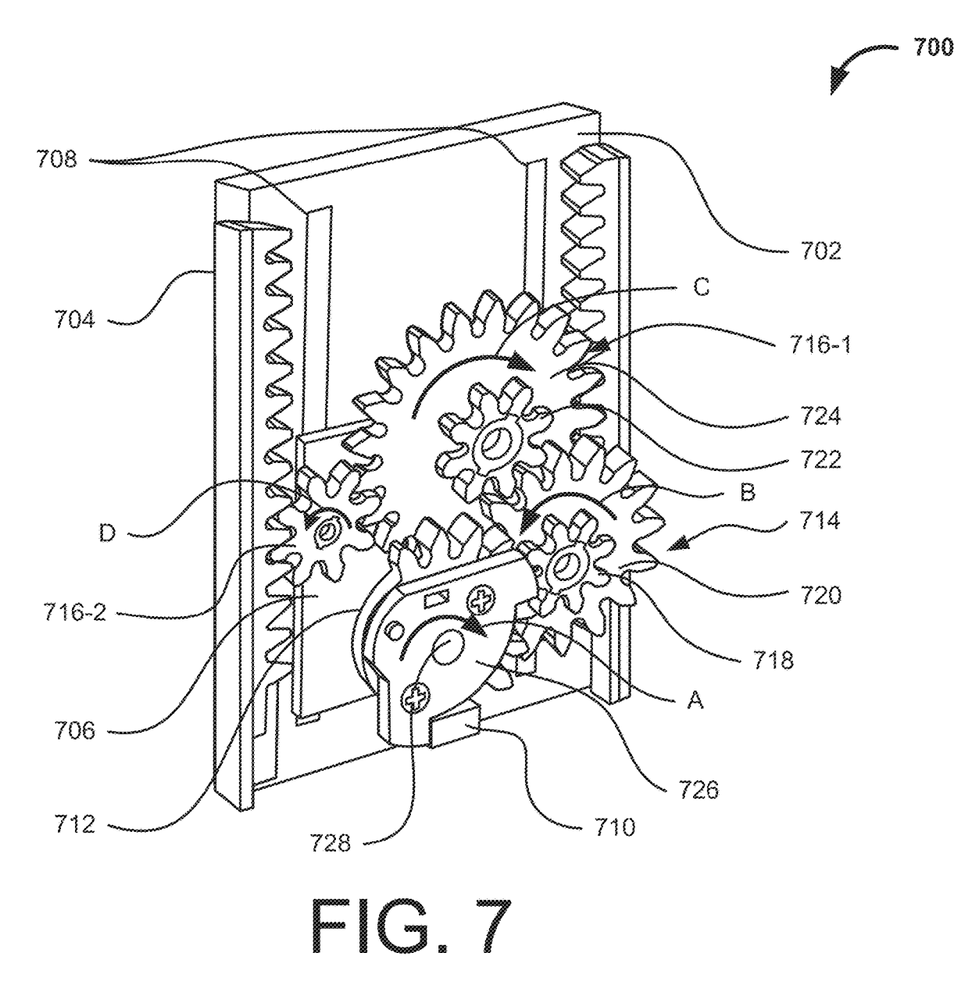
FIG. 7 illustrates a perspective view of a gear assembly, according to an example.

FIG. 7 illustrates a perspective view of a gear assembly 700, according to an example. The gear assembly 700 includes a bracket 702. In an example, the bracket 702 may be made of a metallic material. The gear assembly 700 further includes a pair of toothed racks 704 fixedly mounted on the bracket 702.

Further, the gear assembly 700 includes a base plate 706. The bracket 702, the pair of toothed racks 704, and the base plate 706 are similar to the corresponding components of the stand 200 and are arranged in a manner as described in detail with reference to FIG. 2. In an example, the base plate 706 may slide between the pair of toothed racks 704. In an example implementation, the bracket 702 may include a guiding mechanism, such as a pair of grooves 708. Accordingly, the base plate 706 may engage with the pair of grooves 708 to slide along the length of the bracket 702. In an example, the base plate 706 may include an extension 710 stepped outwards from a bottom portion of the base plate 706.

Further, the base plate 708 may hold a plurality of gears thereon. For example, the plurality of gears may include a mutilated driving gear 712, a driven gear 714, and a pair of pinion gears 716 pivotally connected to the base plate 706. For example, the driven gear 714 include a first wheel 718 and a second wheel 720 and the first pinion gear 716-1 may include a first wheel 722 and a second wheel 724. The plurality of gears may be similar to the gear train 212 and are assembled in a manner as described in detail in FIG. 2.

In the gear assembly 700, the teeth of the mutilated driving gear 712 engage with the teeth of the first wheel 718 of the driven gear 714. Further, the teeth of the second wheel 720 of the driven gear 714 engage with the first wheel 722 of the first pinion gear 716-1. In addition, the teeth of the second wheel 724 of the first pinion gear 716-1 mesh with corresponding teeth of the second pinion gear 716-2. Further, the teeth of the second wheel 724 of the first pinion gear 716-1 and teeth of the second pinion gear 716-2 engage with the pair of toothed racks 704.

In an example implementation, the mutilated driving gear 712 may have 16 teeth, the first wheel 718 of the driven gear 714 may have 8 teeth, the second wheel 720 of the driven gear 714 may have 16 teeth, the first wheel 722 of the first pinion gear 716-1 may have 8 teeth, the second wheel 724 of the first pinion gear 716-1 may have 20 teeth, and the second pinion gear 716-2 may have 8 teeth.

In an example implementation, the gear assembly 700 includes a control member 726. The control member 726 is disposed over the mutilated driving gear 712 and may cooperate with the extension 710 of the base plate 706. The control member 726 may control or restrict the rotation of a display unit (not shown) to about 90 degrees. In an example, the control member 726 may include two arms projecting outwards to form an L-shaped structure. Further, the control member 726 is rotatably connected to the mutilated driving gear 712 about a pivot point 728.

In operation, the mutilated driving gear 712 may rotate to about 90 degrees along the pivot point 728. In an example, the rotation of the mutilated driving gear 712 in a clockwise direction (as depicted by arrow A) may be controlled by the control member 726. An arm of the control member 726 proximal to the extension 710 may rotate clockwise to abut with the extension 710, thereby stopping any further rotation of the mutilated driving gear 712. The quarter rotation of the mutilated driving gear 712 is transferred as full rotations of the pair of pinion gears 716 by the driven gear 714.

For example, upon one-fourth rotation of the mutilated driving gear 712 in the clockwise direction, as the first wheel 718 of the driven gear 714 has 8 teeth, the first wheel 718 may perform half rotate in an anticlockwise direction, as depicted by arrow B. The half-rotation of the first wheel 718 of the driven gear 714 may cause the second wheel 720 of the driven gear 714, having 16 teeth, to take half rotation in the anticlockwise direction. This may cause the first wheel 722 of the first pinion gear 716-1 to complete one rotation in a clockwise direction as depicted by arrow C. The complete rotation of the first wheel 722 of the first pinion gear 716-1 may cause the second wheel 724 of the first pinion gear 716-1, having 20 teeth, to take one complete rotation in the clockwise direction. As the second wheel 724 of the first pinion gear 716-1 is mechanically interfaced with the second pinion gear 716-2, the complete rotation of the second wheel 724 of the first pinion gear 716-1 may initiate multiple rotations of the second pinion gear 716-2, having 8 teeth, as depicted by arrow D.

As the teeth of the pair of pinion gears 716 is meshed with the corresponding teeth of the pair of toothed racks 704, the rotational motion of the pair of pinion gears 716 may be converted into a rectilinear motion. As a result, the base plate 706 bearing the plurality of gears may move up and down along the pair of toothed racks 704. Thus, a small rotation of the mutilated driving gear 712 may get transformed into multiple rotations of the pair of pinion gears 716.

Based on the above explanation, a gear ratio for the gear assembly 700 may be computed as:

$$\text{gear ratio} = \frac{\text{number of teeth of the first wheel of the driven gear}}{\text{number of teeth of the mutilated driving gear}} * \quad (1)$$

$$\frac{\text{number of teeth of the first wheel of the first pinion gear}}{\text{number of teeth of the second wheel of the driven gear}}$$

$$\text{gear ratio} = \frac{8}{16} * \frac{8}{16} = 0.25$$

Figure 8A:
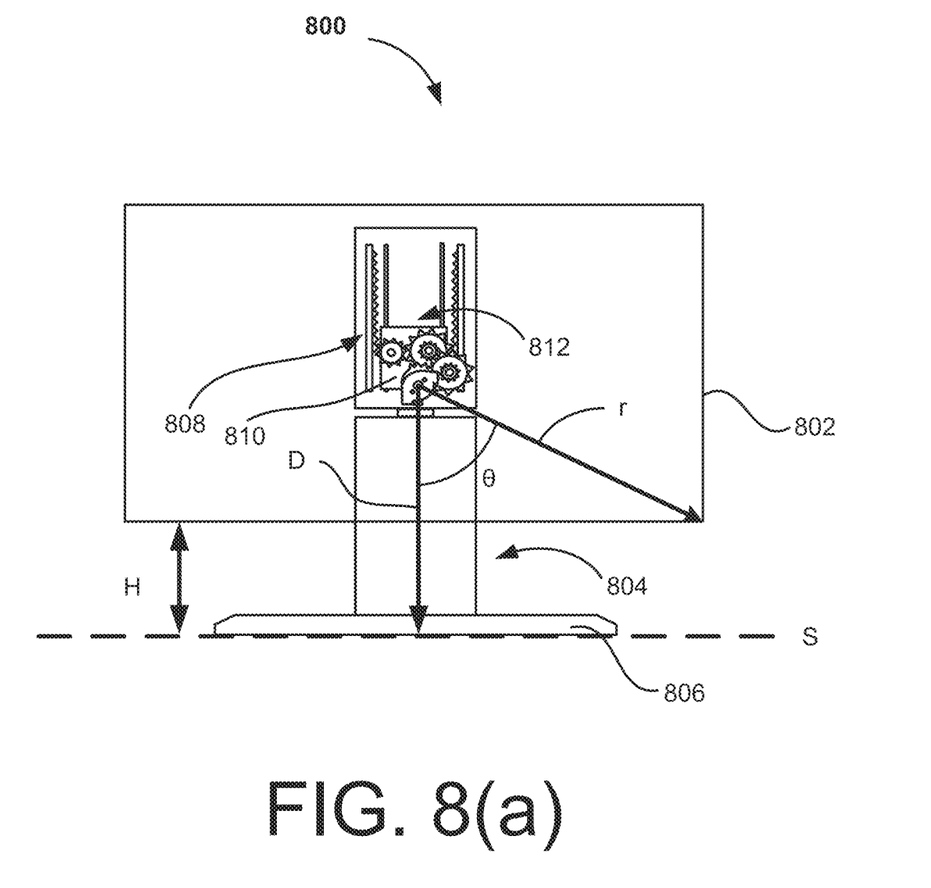
FIGS. 8(a), 8(b), and 8(c) illustrate a schematic of change in orientation of a display device, according to an example.

In an example implementation, by varying a gear ratio between the mutilated driving gear 712, the driven gear 714, the first pinion gear 716-1, and the second pinion gear 716-2, a height increment based on a size of a display unit (not shown) may be achieved. Details pertaining to achieving the height increment are described with reference to FIG. 8.

Figure 8B:
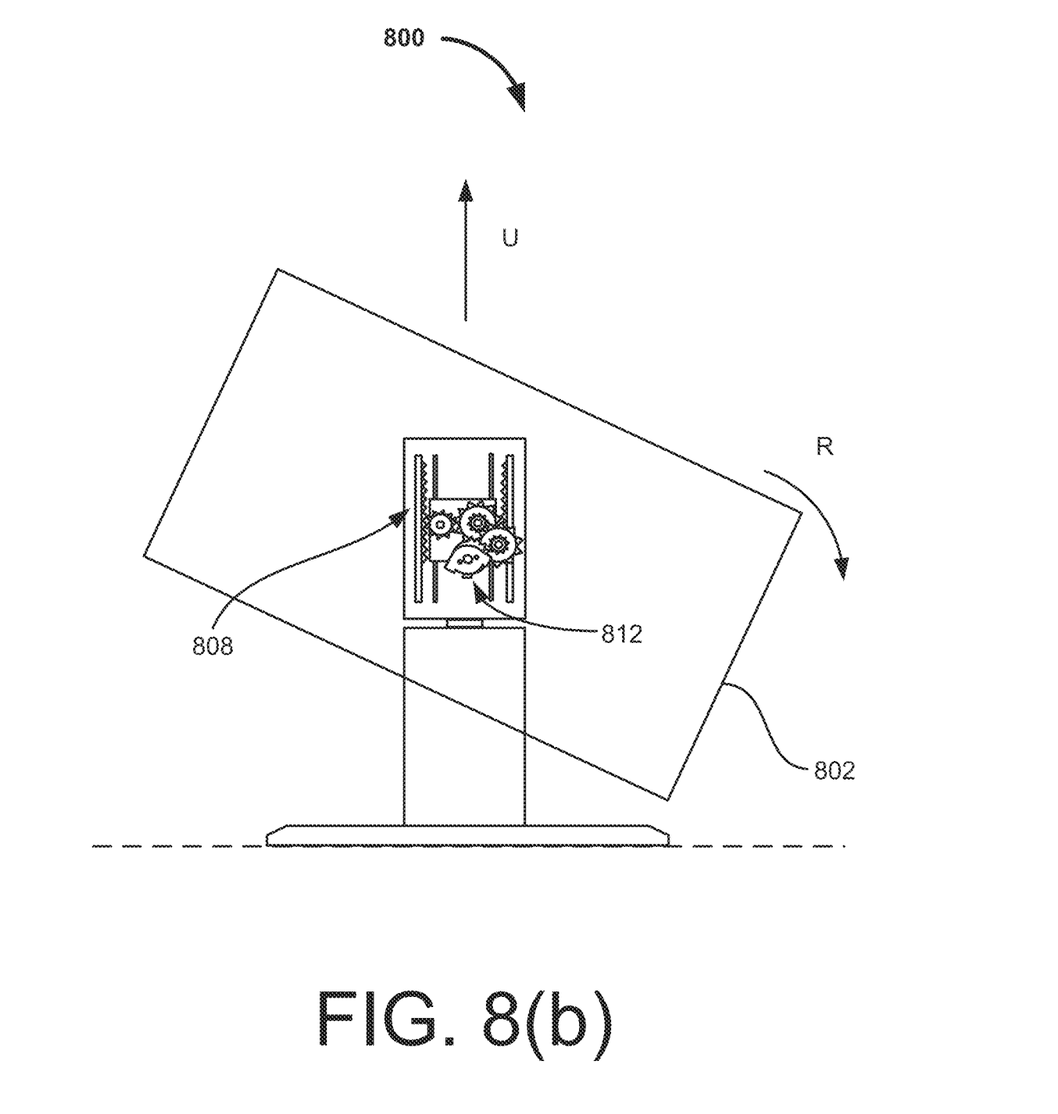
Figure 8C:
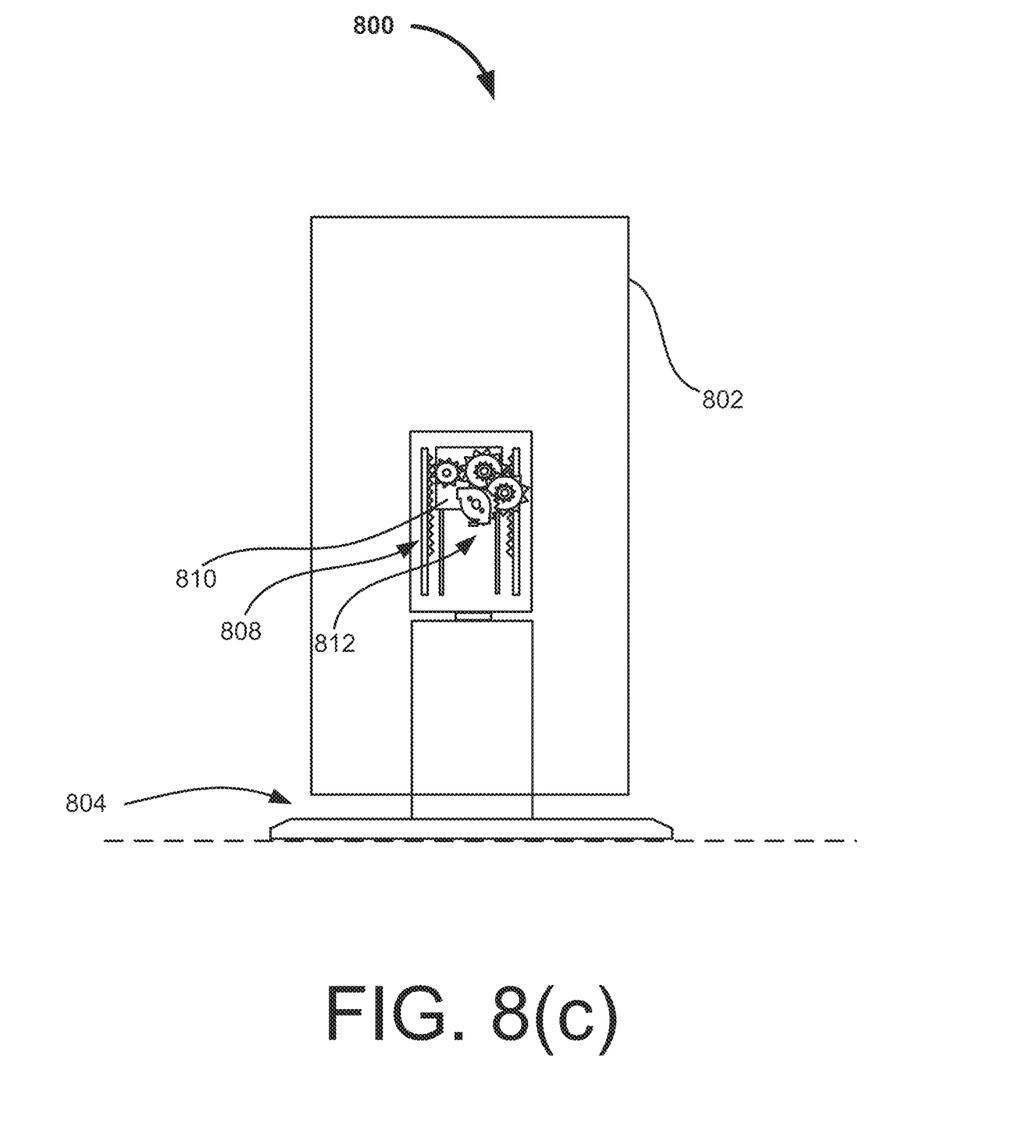

FIGS. 8(a) to 8(c) illustrate a schematic of change in orientation of a display device 800, according to an example. The display device 800 may include a display unit 802, a stand 804 having a base 806, and a gear assembly 808. The gear assembly 808 may include a base plate 810 to support a gear train 812. The display device 800 is similar to the display device 400, 500, and 600 and the above-mentioned components of the display device 800 are arranged in a manner as described in detail with reference to FIGS. 4, 5, and 6.

Referring to FIG. 8(a), in a normal viewing position, when a user may face a screen of the display unit 802, the display unit 802 may be considered to be in a landscape orientation. For example, in the landscape orientation, the display unit 802 is oriented horizontally, i.e., the display unit 802 is wider than it is tall. To change the orientation of the display unit 802, the user may rotate the display unit 802.

In an example implementation, the base plate 810 of the display device 800 may move the display unit 802 to a suitable distance such that the display unit 802 does not come in contact with a surface 'S' on which the stand 806 rests. In this respect, a distance 'D' of the display unit 802 from the surface 'S' may be computed as:

$$D = \frac{r}{2}\cos\theta + H \quad (2)$$

where, r is the radius of the display unit 802, θ is an angle formed between a perpendicular line connecting a centre of the pivot pin to the surface 'S' and the radius of the display unit 802, and H is a height of the display unit 802 from the surface 'S', as depicted in FIG. 8(a).

TABLE 1

| Display Aspect Ratio (16:9) | r (mm) | D (mm) | Height Increment (mm) |
|---|---|---|---|
| 24" | 24"/2 = 304.8 | 304.8 * cos(60.6) + 50 = 199.5 | 105.3 |
| 21.5" | 21.5"/2 = 273.0 | 273.0 * cos(60.6) + 50 = 183.8 | 89.2 |

Table 1 above provides exemplary height increment that may be achieved by display units of different sizes to avoid collision with the surface 'S', while rotating. For example, for a 24 inches display unit 802, a radius 'r' of the display unit 802 is about 304.8 millimeters, the height 'H' of the display unit 802 from the surface 'S' is about 50 millimeters, the distance 'D' (computed based on equation (2)) is about 199.5 mm, and an angle formed between a perpendicular line connecting the centre of a pivot pin to the surface 'S' and the radius 'r' is about 60.6 degrees, the height increment being achieved based on the gear assembly 808 of the present subject matter is about 105.3 mm.

Therefore, the gear ratio of the gear assembly 808 of the present subject matter may facilitate a height increment of more than 100 millimetres for the display unit 802 of 24 inches. Accordingly, based on an aspect ratio of the display device 802, the gear ratio of the gear assembly 808 may be varied to move the display unit 802 by comfortably.

Although, the distance 'D' and the height 'H' are computed with respect to the surface 'S', the distance 'D' and the height 'H' may be computed with respect to an upper surface of the base 806, based on dimensions of stands for different display devices.

Referring now to FIG. 8(b), when the display unit 802 is rotated clockwise as depicted by arrow R, the gear assembly 808 of the display device 800 may get actuated. The gear assembly 808 may be similar to the gear assembly 700. In an example, the display unit 802 may be pivotably coupled to the gear assembly 808. The rotation of the display unit 802 may rotate a mutilated driving gear (not shown) of the gear train 812 which may in turn rotate a pair of pinion gears (not shown). As the pair of pinion gears are meshed with a pair of toothed racks (not shown), the display unit 802 may be lifted upwards in a direction depicted by arrow U.

Referring to FIG. 8(c), the rotation of the display unit 802 may be controlled by a control member (not shown) of the gear assembly 808. The control member may rotate about 90 degrees along with the mutilated driving gear. Further, the control member may abut or lock with an extension (not shown) of the base plate 810 of the gear assembly 808. As may be seen clearly from FIG. 8(c), the base plate 810 along with the gear train 812 may move upwards in the direction of arrow U. The control member may lock the base plate 810 in the raised position and may prevent the display unit 802 from sliding back and contacting the base 806 of the stand 804.

The present subject matter therefore facilitates in rotating a display unit between a landscape orientation and a portrait orientation while maintaining a safe distance from the base of the stand. In addition, the present subject matter enables moving up of the display unit to an appropriate height irrespective of the size of the display unit and with minimal efforts.

Although examples for the present disclosure have been described in language specific to structural features and/or methods, it is to be understood that the appended claims are not limited to the specific features or methods described herein. Rather, the specific features and methods are disclosed and explained as examples of the present disclosure.

I claim:

1. A stand for a display unit, comprising:
   a base;
   a column fixedly mounted on the base;
   a pair of rack gears coupled to a free end of the column;
   a gear train operably coupled to the pair of rack gears, wherein the gear train comprises:
      a mutilated driving gear to be coupled to the display unit; and
      a pair of pinion gears operably coupled to the mutilated driving gear, wherein the pair of pinion gears is meshed with the pair of rack gears such that upon actuation of the mutilated driving gear through rotation of the display unit, the pair of pinion gears is rotated relative to the pair of rack gears to cause movement of the gear train along the pair of rack gears.

2. The stand as claimed in claim 1, wherein the pair of rack gears is in a plane parallel to a plane of the column.

3. The stand as claimed in claim 1, wherein the stand comprises:
a guide rail along a length of the pair of gear racks; and
a base plate slidably mounted on the guide rail, wherein the gear train is mounted on the base plate such that rotation of the pair of pinion gears relative to the pair of gear racks moves the base plate along the guide rail.

4. The stand as claimed in claim 1, wherein the gear train comprises a driven gear meshable with the mutilated driving gear and a pinion gear from the pair of pinion gears.

5. The stand as claimed in claim 1, wherein the stand comprises a friction pad to control rotation of the gear train.

6. The stand as claimed in claim 1, wherein the mutilated driving gear is rotatable by an angle of about 90 degrees.

7. The stand as claimed in claim 1, wherein the pair of rack gears and the pair of pinion gears are made of a plastic material.

8. The stand of claim 1, wherein the gear train further comprises a control member that restricts full rotation of the mutilated driving gear.

9. A display device comprising:
a stand having a base and a column affixed to the base,
a gear assembly pivotably coupled to a free end of the column, the gear assembly comprising:
a bracket;
a pair of toothed racks disposed along a length of the bracket;
a pair of pinion gears cooperating with the pair of toothed racks;
a driving gear operably coupled to the pair of pinion gears; and
a display unit coupled to the driving gear, wherein upon rotation of the display unit, the driving gear is actuated to cause the pair of pinion gears rotate relative to the pair of toothed racks, wherein a rotational motion of the pair of pinion gears imparts translational motion in the display unit along a length of the pair of the toothed racks,
wherein the gear assembly comprises a base plate slidably mounted on the bracket, wherein the driving gear and the pair of pinion gears is mounted on the base plate such that rotation of the pair of pinion gears relative to the pair of toothed racks moves the base plate along the bracket.

10. The display device as claimed in claim 9, wherein the base plate comprises a protruding member and the bracket comprises a slot cooperating with the base plate, the protruding member extends through the slot to slide the base plate along the bracket.

11. The display device as claimed in claim 9, wherein the gear assembly comprises a driven gear meshable with the driving gear and one of a pinion gear from the pair of pinion gears.

12. The display device as claimed in claim 9, wherein the driving gear is a mutilated gear.

13. The display device of claim 9, wherein the display unit is coupled to the driving gear so that the display unit and the driving gear have the same axis of rotation.

14. The display device of claim 9, wherein the gear assembly further comprises a control member that engages with the base plate to restrict rotation of the display unit to about 90 degrees.

15. A display device comprising:
a stand;
a gear assembly hingedly connected to the stand, the gear assembly comprising:
a bracket;
a pair of toothed racks fixedly mounted along a length of the bracket, wherein the pair of toothed racks are parallel to each other;
a base plate disposed on the bracket such that the base plate is movable between the pair of toothed racks;
a plurality of gears mounted on the base plate, wherein the plurality of gears comprises:
a mutilated driving gear;
a driven gear meshable with the mutilated driving gear; and
a pair of pinion gears operably coupled to the driven gear, wherein the pair of pinion gears is meshed with the pair of toothed racks; and
a display unit rotatably coupled to the gear assembly, wherein upon rotation of the display unit, the mutilated driving gear actuates the driven gear to initiate rotation of the pair of pinion gears relative to the pair of toothed racks, wherein the rotation of the pair of pinion gears moves the display unit along a length of the pair of the toothed racks.

16. The display device as claimed in claim 15, wherein the bracket comprises a guiding mechanism to move the base plate with respect to the bracket.

17. The display device of claim 16, wherein the guiding mechanism includes a guide rail and the base plate includes wheels to slide or roll over the guide rail.

18. The display device of claim 16, wherein the guiding mechanism includes grooves and the base plate is to slide along the grooves.

19. The display device as claimed in claim 15, wherein the mutilated driving gear is rotatable by an angle of about 90 degrees.

* * * * *